(12) United States Patent
Karikalan

(10) Patent No.: US 9,288,893 B2
(45) Date of Patent: Mar. 15, 2016

(54) IMPLEMENTATIONS OF TWISTED DIFFERENTIAL PAIRS ON A CIRCUIT BOARD

(75) Inventor: Sampath Komarapalayam Velayudham Karikalan, Chandler, AZ (US)

(73) Assignee: Broadcom Corporation, Irvine, CA (US)

( * ) Notice: Subject to any disclaimer, the term of this patent is extended or adjusted under 35 U.S.C. 154(b) by 876 days.

(21) Appl. No.: 12/537,430

(22) Filed: Aug. 7, 2009

(65) Prior Publication Data

US 2010/0200276 A1   Aug. 12, 2010

Related U.S. Application Data

(60) Provisional application No. 61/151,767, filed on Feb. 11, 2009.

(51) Int. Cl.
    H05K 1/00    (2006.01)
    H05K 3/10    (2006.01)
    H05K 1/02    (2006.01)

(52) U.S. Cl.
    CPC ........ *H05K 1/0245* (2013.01); *H05K 2201/097* (2013.01); *H05K 2201/09245* (2013.01); *Y10T 29/49155* (2015.01)

(58) Field of Classification Search
    CPC .......... H05K 1/0245; H05K 2201/097; H05K 2201/09245
    USPC ............................................. 174/250, 32, 33
    See application file for complete search history.

(56) References Cited

U.S. PATENT DOCUMENTS

| | | | |
|---|---|---|---|
| 3,757,028 A * | 9/1973 | Schlessel | 174/33 |
| 5,389,735 A * | 2/1995 | Bockelman | 174/33 |
| 5,416,734 A * | 5/1995 | Hidaka et al. | 365/63 |
| 5,646,368 A * | 7/1997 | Muyshondt et al. | 174/33 |
| 6,504,246 B2 * | 1/2003 | Roth et al. | 257/750 |
| 6,774,741 B2 * | 8/2004 | McCurdy et al. | 333/1 |
| 6,916,996 B2 * | 7/2005 | Kuan et al. | 174/262 |
| 6,992,377 B2 * | 1/2006 | Zhou et al. | 257/692 |
| 7,554,829 B2 * | 6/2009 | Forbes et al. | 365/51 |
| 7,830,221 B2 * | 11/2010 | Merritt | 333/1 |

* cited by examiner

*Primary Examiner* — William H Mayo, III
*Assistant Examiner* — Hiram E Gonzalez
(74) *Attorney, Agent, or Firm* — Fiala & Weaver P.L.L.C.

(57) ABSTRACT

A twisted differential conductor pair is formed on a circuit board that includes first-third conductors. The second conductor includes first-third portions. The second portion of the second conductor extends between an end of the first conductor and an end of the third conductor, and couples an end of the first portion of the second conductor to an end of the third portion of the second conductor. A solder mask layer is formed over the first, second, and third conductors on the circuit board. An end of the first conductor and the end of the third conductor are exposed through the solder mask layer. The exposed end of the first conductor is coupled to the exposed end of the third conductor over the solder mask layer with a bridge. This configuration may be repeated to create multiple twists along the twisted differential conductor pair.

20 Claims, 9 Drawing Sheets

400

402
form a first conductor, a second conductor, and a third conductor on a circuit board, a second portion of the second conductor extending between an end of the first conductor and an end of the third conductor and coupling an end of a first portion of the second conductor to an end of a third portion of the second conductor 404
form an electrically insulating solder mask layer over the first, second, and third conductors on the circuit board 406
expose the end of the first conductor and the end of the third conductor through the solder mask layer 408
couple the exposed end of the first conductor to the exposed end of the third conductor over the solder mask layer with an electrically conductive bridge

FIG. 4

1402 — configure at least one of an area of a loop formed by the second conductor, the third conductor, the first bridge, and the second bridge and/or a distance between the second portion of the second conductor and the second portion of the third conductor to enable a desired electrical performance

IMPLEMENTATIONS OF TWISTED DIFFERENTIAL PAIRS ON A CIRCUIT BOARD

This application claims the benefit of U.S. Provisional Application No. 61/151,767, filed on Feb. 11, 2009, which is incorporated by reference herein in its entirety.

BACKGROUND OF THE INVENTION

1. Field of the Invention

The present invention relates to twisted differential pair electrical conductors on circuit boards.

2. Background Art

Differential signaling is a technique for transmitting information electrically in the form of a pair of complementary signals transmitted on separate conductors. Twisted differential pairs may be used in differential signal transmission over long transmission lines, where a significant amount of crosstalk in differential mode may exist between adjacent differential pairs. In a twisted differential pair, the two conductors are twisted around each other such that the two conductors more closely receive the same interference. The pitch of the twists (distance between adjacent twists) is typically configured such that desired signal parameters in differential mode, such as rise time, are not compromised significantly, while minimizing the cross-talk between adjacent pairs due to the reduced differential loop areas and the location of the cross-overs of the twists. Also, EMI radiation from the differential loops formed in a twisted differential pair by the twisting is reduced due to the reduced loop areas.

Such twisted differential pairs are used in cables and wires, and may also be implemented in long traces on circuit boards to achieve the above described performance benefits. Current techniques for implementing a twisted differential pair on a circuit board require more than one metal layer for routing the signal traces to facilitate the cross-over between the traces. The two conductors of the conductor pair are routed on a first metal layer of the circuit board, and the cross-over routing is formed on a second metal layer of the circuit board. Vias through the circuit board are used to connect the conductor pair with the cross-over routing between the first and second metal layers.

Such conventional techniques for implementing twisted differential pairs in circuit boards have numerous deficiencies. For instance, the requirement for more than one metal layer typically results in a cost increase for the circuit board. Furthermore, the requirement for vias through the circuit board can result in associated performance issues, such as impedance mismatches due to the increased capacitances at the via pads, and may cause routing density issues.

BRIEF SUMMARY OF THE INVENTION

Methods, systems, and apparatuses are described for twisted differential conductor pairs on a circuit board, substantially as shown in and/or described herein in connection with at least one of the figures, as set forth more completely in the claims.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

FIG. 4 shows a flowchart for forming a differential signal conductor pair, according to an example embodiment.

Figure 1:
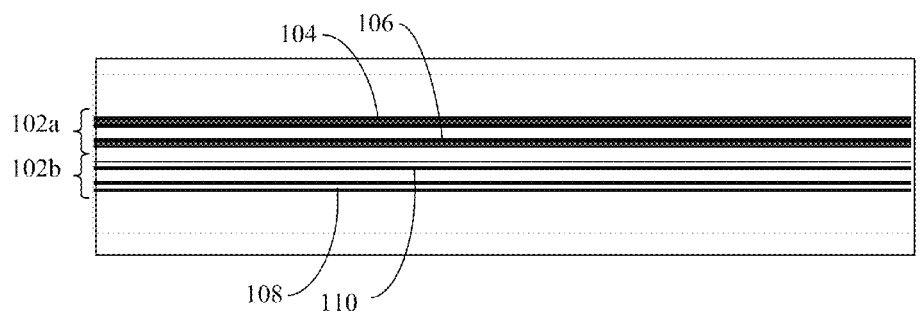
FIG. 1 shows a top view of a circuit board having two differential conductor pairs with no twists.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

I. Introduction

The present specification discloses one or more embodiments that incorporate the features of the invention. The disclosed embodiment(s) merely exemplify the invention. The scope of the invention is not limited to the disclosed embodiment(s). The invention is defined by the claims appended hereto.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

Furthermore, it should be understood that spatial descriptions (e.g., "above," "below," "up," "left," "right," "down," "top," "bottom," "vertical," "horizontal," etc.) used herein are for purposes of illustration only, and that practical implementations of the structures described herein can be spatially arranged in any orientation or manner.

II. Example Embodiments

Differential pairs may be used to transmit differential signals over transmission lines in circuit boards. For example, FIG. 1 shows a top view of a circuit board 100. As shown in FIG. 1, first and second differential conductor pairs 102a and 102b are formed on circuit board 100. First differential conductor pair 102a includes a first conductor 104 and a second conductor 106 that are routed in parallel across circuit board 100. Second differential conductor pair 102b includes a third conductor 108 and a fourth conductor 110 which are routed in parallel across circuit board 100. First and second differential conductor pairs 102a and 102b are routed in parallel across circuit board 100. First differential conductor pair 102a is configured to transmit a first differential signal across circuit board 100, and second differential conductor pair 102b is configured to transmit a second differential signal across circuit board 100.

First and second differential conductor pairs 102a and 102b are non-twisted. In embodiments, twisted differential conductor pairs are provided. In a twisted differential conductor pair, the two conductors of the pair are twisted around each other. Differential conductor pairs formed in circuit boards, such as pairs 102a and 102b, cannot easily be formed to be twisted, and such non-twisted differential conductor pairs have decreased electrical performance (e.g., with regard to noise immunity, etc.) relative to twisted differential conductor pairs. Conventional techniques for implementing twisted differential pairs in circuit boards have numerous deficiencies, including increase board cost, performance issues, and routing density issues.

In embodiments, cross-over routing is enabled to be formed in a twisted differential conductor pair in/on a circuit board, with both conductors of the differential pair being formed on the same metal layer, without the need for adding more metal layers or using vias to form the cross-over routing. Instead, the cross-over routing is formed on solder mask layer or other protective coating that is formed on the circuit board.

Figure 2:
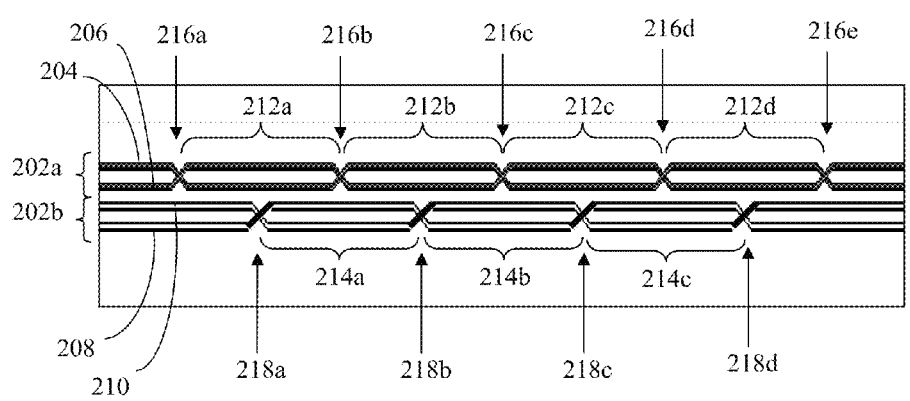
FIG. 2 shows a top view of a circuit board having two twisted differential conductor pairs, according to an example embodiment.

For instance, FIG. 2 shows a top view of a circuit board 200, according to an example embodiment. As shown in FIG. 2, first and second differential conductor pairs 202a and 202b are formed on circuit board 200. First differential conductor pair 202a includes a first conductor 204 and a second conductor 206 that are routed across circuit board 200. Second differential conductor pair 202b includes a third conductor 208 and a fourth conductor 210 that are routed across circuit board 200. First and second differential conductor pairs 202a and 202b are routed in parallel across circuit board 200. First differential conductor pair 202a is configured to transmit a first differential signal across circuit board 200, and second differential conductor pair 202b is configured to transmit a second differential signal across circuit board 200.

As shown in FIG. 2, first and second conductors 204 and 206 of first differential conductor pair 202a are twisted together, and third and fourth conductors 208 and 210 of second differential conductor pair 202b are twisted together. As further described below, each of first-fourth conductors 204, 206, 208, and 210 include a plurality of conductor segments that are electrically coupled together in series to first-fourth conductors 204, 206, 208, and 210, and to enable first and second differential conductor pairs 202a and 202b to each be twisted.

As shown in FIG. 2, first differential conductor pair 202a includes first-fifth cross-over locations 216a-216e. Cross-over locations 216a-216e are locations along first differential conductor pair 202a where a twist is formed with first and second conductors 204 and 206. At each of cross-over locations 216a-216e, one of first and second conductors 204 and 206 crosses under the twist (e.g., is routed on the same layer as first and second conductors 204 and 206) from a first side to a second side of first differential conductor pair 202a, and the other of first and second conductors 204 and 206 crosses over (e.g., is routed on a solder mask layer) the twist from the second side to the first side of first differential conductor pair 202a to form the corresponding twist.

Figure 3:
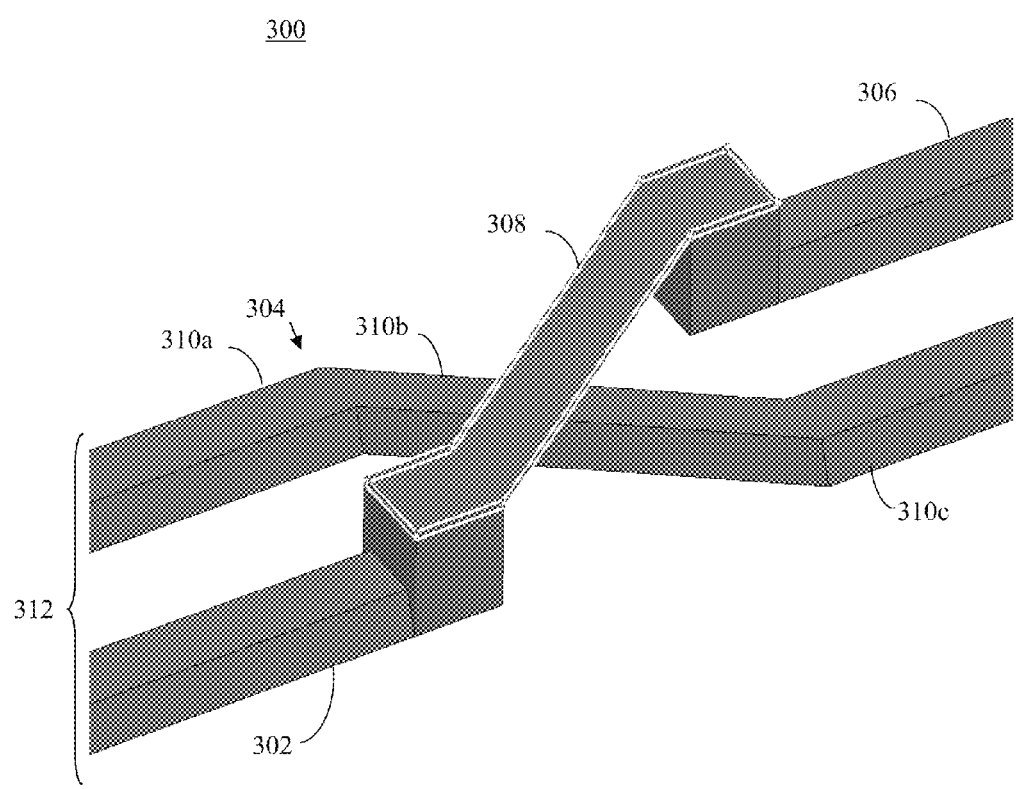
FIG. 3 shows a perspective view of a cross-over location in a twisted differential conductor pair, according to an example embodiment.

Cross-over and cross-under routing at each of cross-over locations 216 may be configured in various ways. For instance, FIG. 3 shows a perspective view of a cross-over location 300 in a twisted differential conductor pair 312, according to an example embodiment. Twisted differential conductor pair 312 may be either of first and second differential conductor pairs 202a and 202b, for example. As shown in FIG. 3, twisted differential conductor pair 312 includes a first conductor 302, a second conductor 304, and a third conductor 306, which may each be formed on an electrically insulating layer of a circuit board (not visible in FIG. 3). As shown in FIG. 3, second conductor 304 includes a first portion 310a, a second portion 310b, and a third portion 310c. Second conductor 304 is continuous through cross-over location 300, while disconnected ends of first and third conductors 302 and 306 are present at cross-over location 300. Second portion 310b of second conductor 304 extends between an end of first conductor 302 and an end of third conductor 306, and couples an end of first portion 310a of second conductor 304 to an end of third portion 310c of second conductor 304. An electrically conductive bridge 308 (e.g., formed on a solder mask layer not visible in FIG. 3, for ease of illustration) is coupled (e.g., through a first opening in the solder mask layer) to the end of first conductor 302 and to the end of third conductor 306 (e.g., through a second opening in the solder mask layer). Bridge 308 is cross-over routing that bridges over second portion 310b of second conductor 304 (which is the "cross-under" routing), such that bridge 308 is electrically isolated from second conductor 304, to electrically couple together first and third conductors 302 and 306.

The configuration of cross-over location 300 may be repeated at each cross-over location 216 and 218 of twisted differential conductor pairs 202a and 202b in FIG. 2. At each of cross-over locations 216a-216e, cross-over routing of one of first and second conductors 204 and 206 crosses over cross-under routing of the other of first and second conductors 204 and 206. For instance, at the far left side of circuit board 200 shown in FIG. 2, first conductor 204 is on a first side (e.g., an upper side in FIG. 2) of first differential conductor pair 202a in FIG. 2, and second conductor 204 is on a second side (e.g., a lower side in FIG. 2) of first differential conductor pair 202a in FIG. 2. At cross-over location 216a, first and second conductors 204 and 206 are twisted, such that second conductor 206 includes cross-over routing that routes over cross-under routing of first conductor 204. As such, between first cross-over location 216a and second cross-over location 216b, first and second conductors 204 and 206 have switched positions, such that first conductor 204 is on the lower side of first differential conductor pair 202a in FIG. 2, and second conductor 204 is on the upper side of first differential conductor pair 202a in FIG. 2. At cross-over location 216b, first and second conductors 204 and 206 are again twisted, such that first conductor 204 includes cross-over routing that routes over cross-under routing of second conductor 206. As such, between second cross-over location 216b and second cross-over location 216c, first and second conductors 204 and 206 have again switched positions, such that first conductor 204 is on the upper side of first differential conductor pair 202a in FIG. 2, and second conductor 204 is on the lower side of first differential conductor pair 202a in FIG. 2. This pattern repeats across first differential conductor pair 202a on circuit board 200, with first and second conductors 204 and 206 being twisted at each of cross-over locations 216c-216e, switching positions due to cross-over and cross-under routing.

As such, between each adjacent pair of cross-over locations 216 of first differential conductor pair 202a, a corresponding loop 212 is formed in first differential conductor pair 202a. For example, as shown in FIG. 2, a loop 212a is formed between cross-over locations 216a and 216b, a loop 212b is formed between cross-over locations 216b and 216c, a loop 212c is formed between cross-over locations 216c and 216d, and a loop 212d is formed between cross-over locations 216a and 216e. Each loop 212 has an area defined by a spacing between first and second conductors 204 and 206, and a length of first and second conductors along the loop 212 (e.g., the distance between the corresponding cross-over locations, also referred to as the twist pitch).

Note that although five cross-over locations 216a-216e representing twists in first differential conductor pair 202a are shown in FIG. 2, any number of cross-over locations 216 may be included in a differential pair, including tens of cross-over locations 216, hundreds of cross-over locations 216, thousands of cross-over locations 216, etc., according to embodiments. As such, any number of corresponding loops 212 may be present in first differential conductor pair 202a, depending on the number of cross-over locations 216. Furthermore, as shown in FIG. 2, second differential conductor pair 202b includes four cross-over locations 218a-218d that are similar to cross-over locations 216 of first differential conductor pair 202a, and includes three loops 214a-214c that are similar to loops 212 of first differential conductor pair 202a. Any number of cross-over locations 218 and loops 214 may be included in second differential conductor pair 202b, in embodiments.

It is noted that in FIG. 1, a non-twisted differential conductor pair, such as differential conductor pairs 102a and 102b in FIG. 1, may be considered to include a single loop that is defined by the spacing between the respective conductors and the length of the respective conductors across the circuit board. The loops of differential conductor pairs 102a and 102b in FIG. 1 are much larger (e.g., in area) than each of loops 212 and 214 of differential conductor pairs 202a and 202b in FIG. 2. As such, an electrical performance of differential conductor pairs 202a and 202b of FIG. 2 may be improved relative to that of differential conductor pairs 102a and 102b of FIG. 1. For example, differential conductor pairs 202a and 202b may have reduced differential mode crosstalk between adjacent differential pairs (e.g., between first and second differential conductor pairs 102a and 102b) due to the reduced differential loop areas and the location of the crossovers of the twists. For example, as shown in FIG. 2, cross-over locations 212 and 214 of first and second differential conductor pairs 202a and 202b may be staggered with respect to each other to provide performance benefits. Furthermore, differential conductor pairs 202a and 202b may generate less EMI radiation as compared to differential conductor pairs 102a and 102b due to the reduced loop areas.

Embodiments described herein may be implemented in any electronic device, including large back-planes and low cost consumer electronics boards, such as satellite receivers. Example embodiments for twisted differential conductor pairs, such as differential conductor pairs 202a and 202b of FIG. 2, are described in further detail in the following subsections.

A. Example Embodiments for Forming Twisted Differential Conductor Pairs

Twisted differential conductor pairs may be formed in various ways, according to embodiments. For instance, FIG. 4 shows a flowchart 400 for forming a differential signal conductor pair, according to an example embodiment. Flowchart 400 may be used to form twists in each of first and second differential conductor pairs 202a and 202b on circuit board 200, for instance. Flowchart 400 is described with respect to FIGS. 5-11, which show views of a circuit board 500 at different points during a fabrication process, according to example embodiments. Other structural and operational embodiments will be apparent to persons skilled in the relevant art(s) based on the discussion regarding flowchart 400.

Figure 5:
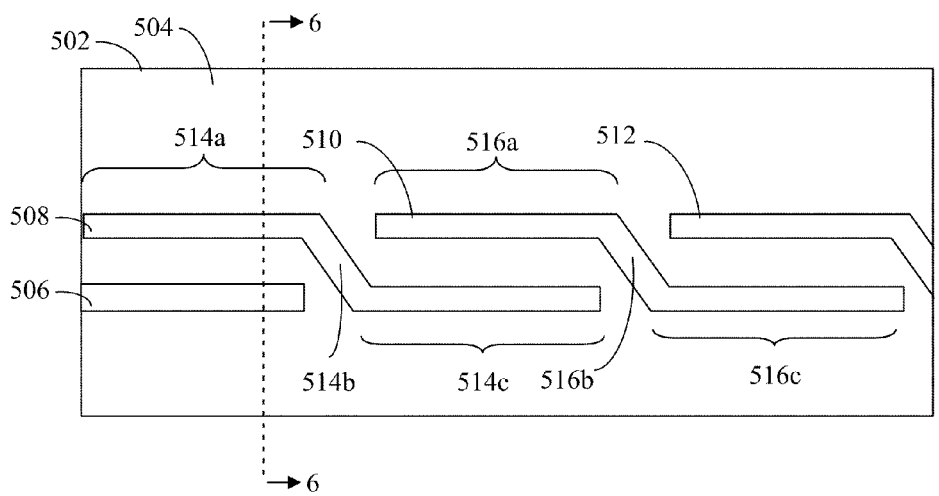
FIGS. 5-11 show views of a circuit board at different points during a fabrication process, according to example embodiments.
Figure 6:
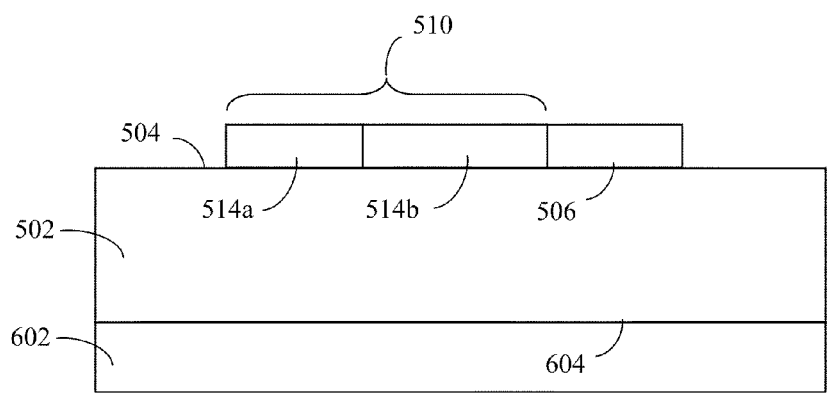

In step 402, a first conductor, a second conductor, and a third conductor are formed on a circuit board, a second portion of the second conductor extending between an end of the first conductor and an end of the third conductor and coupling an end of the first portion of the second conductor to an end of the third portion of the second conductor. For example, FIG. 5 shows a top view of circuit board 500, and FIG. 6 shows a cross-sectional view of circuit board 500 of FIG. 5, according to an example embodiment. As shown in FIG. 5, a first conductor 506, a second conductor 508, a third conductor 510, and a fourth conductor 512 are formed on a surface 504 of an electrically insulating layer 502 of circuit board 500. In the example of FIG. 5, second conductor 508 has a first portion 514a, a second portion 514b, and a third portion 514c that are connected in series. Third conductor 510 has a first portion 516a, a second portion 516b, and a third portion 516c that are connected in series. Second and third conductors 508 and 510 have a similar zig-zag shape. Second conductor 508 has a first bend/angled portion between first and second portions 516a and 516b, and a second bend/angled portion (that bends in an opposite direction from the first bend/angled portion) between second and third portions 516b and 516c. Note that first and fourth conductors 506 and 512 may have similar shapes to second and third conductors 508 and 510 (e.g., portions of first and fourth conductors 506 and 512 may not be visible in FIG. 5) or may be shaped differently. For example, a first portion of first conductor 506, and first and second portions of fourth conductor 512 are shown in FIG. 5. First conductor 506 and fourth conductor 512 may or may not have additional portions that are not visible in FIG. 5. Furthermore, each of first-fourth conductors 506, 508, 510, and 512 may include one or more additional bends/angled portions that are not related to forming twists, if desired for a particular routing.

In the example of FIG. 5, first portion 514a of second conductor 508 is substantially parallel with first conductor 506, and first portion 516a of third conductor 510 is substantially parallel with third portion 514c of second conductor 508. First conductor 506 is substantially colinear with third portion 514c of second conductor 508, and first portion 516a of third conductor 510 is substantially colinear with first portion 514a of second conductor 508. Second portion 514b of second conductor 508 extends between an end of first conductor 506 and an end of first portion 516a of third conductor 510. Second portion 514b couples an end of first portion 514a of second conductor 508 to an end of third portion 514c of second conductor 508. Similarly, first portion 516a of third conductor 510 is substantially parallel with third portion 514c of second conductor 508, and the first portion of fourth conductor 512 is substantially parallel with third portion 516c of third conductor 510. Third portion 514c of second conductor 508 is substantially colinear with third portion 516c of third conductor 510, and the first portion of fourth conductor 512 is substantially colinear with first portion 516a of third conductor 510. Second portion 516b of third conductor 510 extends between an end of third portion 514c of second conductor 508 and an end of the first portion of fourth conductor 512. Second portion 516b couples an end of first portion 516a of third conductor 510 to an end of third portion 516c of third conductor 510. These colinear and/or parallel configurations for portions of first-fourth conductors 506-512 are provided for purposes of illustration, and are not intended to be limiting. First-fourth conductors 506-512 may have alternative configurations.

FIG. 6 shows first-fourth conductors 506-512 (first conductor 506 and portions 514a and 514b of second conductor 510 are visible in FIG. 6) are formed on surface 504 of electrically insulating layer 502. Note that first-fourth conductors 506, 508, 510, and 512 may be formed during a same fabrication process or separate fabrication processes. First-fourth conductors 506, 508, 510, and 512 may be formed in any manner, conventional or otherwise, as would be known to persons skilled in the relevant art(s), such as a photolithography process. For example, first-fourth conductors 506, 508, 510, and 512 may be formed from a sheet that includes one or more layers of electrically conductive material(s), such as a metal foil. An etching process or other process may be used to define first-fourth conductors 506, 508, 510, and 512 in the sheet (e.g., in the shape of a trace, a conductive pad, etc.) as well as further electrically conductive features to be formed in the same layer on electrically insulating layer 502. First-fourth conductors 506, 508, 510, and 512 may be formed of a metal, such as copper, aluminum, gold, silver, tin, nickel, lead, or a combination of metals/alloy, or may be formed of an alternative electrically conductive material. First-fourth conductors 506, 508, 510, and 512 may be attached to electrically insulating layer 502 in any manner, including using an adhesive material (e.g., an epoxy), by a lamination process, or in any other suitable manner, as would be known to persons skilled in the relevant art(s).

Note that circuit board 500 may be any type of circuit board, including a printed circuit board, an integrated circuit package substrate, etc. As shown in FIG. 6, circuit board 500 includes a reference plane layer 602 that is attached to a second surface 604 of electrically insulating layer 502, such that electrically insulating layer 502 is located between reference plane layer 602 and a layer that includes first-fourth conductors 506, 508, 510, and 512. Reference plane layer 602 and electrically insulating layer 502 may be attached together in any manner, including according to conventional circuit board fabrication techniques, as would be known to persons skilled in the relevant art(s). For example, reference plane layer 602 and electrically insulating layer 502 may be attached using an adhesive material (e.g., an epoxy), by a lamination process, or in any other manner. Electrically insulating layer 502 may include any electrically insulating or dielectric material, including an organic, plastic, ceramic, and/or tape material. Example materials for electrically insulating layer 502 include materials such as polyimide, "BT", which includes a resin called bis-maleimide triazine, "FR-4," which is a fire-retardant epoxy resin-glass cloth laminate material, "FR-5," and/or other similar materials. Circuit board 500 may optionally include further layers in additional to the layer that includes first-fourth conductors 506, 508, 510, and 512, reference plane layer 602 and electrically insulating layer 502. A multi-layered version of circuit board 500 may be formed from alternating layers of electrically conductive materials and electrically insulating materials.

Figure 7:
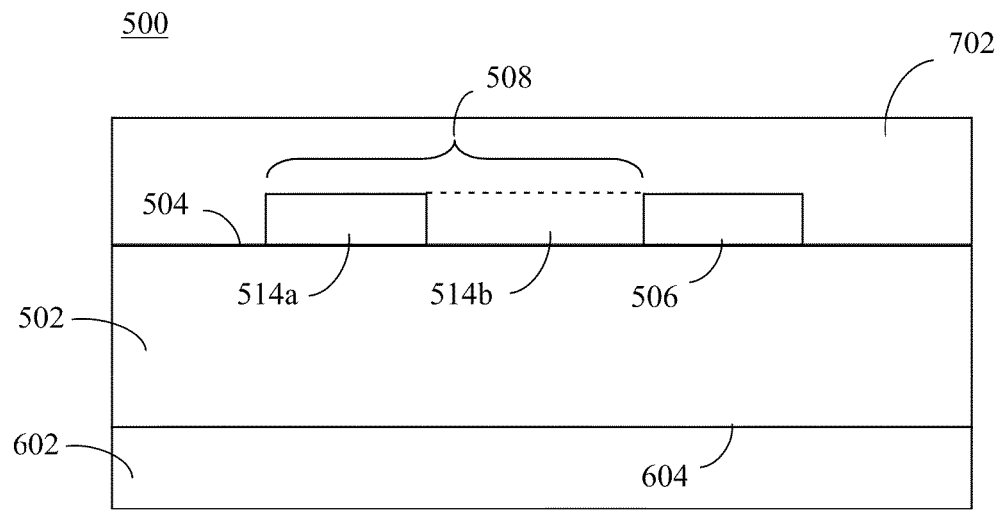

In step 404, an electrically insulating solder mask layer is formed over the first, second, and third conductors on the circuit board. For instance, FIG. 7 shows circuit board 500 with an electrically insulating solder mask layer 702 formed thereon, according to an example embodiment. Solder mask layer 702 is formed on surface 504 of electrically insulating layer 502 and covers first-fourth conductors 506, 508, 510, and 512 on electrically insulating layer 502. Solder mask layer 702 is a solder mask or solder resist material, such as a polymer or plastic, that provides a protective coating for electrically conductive features (including conductors 506, 508, 510, and 512) on circuit board 500, prevents solder from bridging between conductors, thereby preventing short circuits, and/or provides further benefits, as would be known to persons skilled in the relevant art(s). In embodiments, solder mask layer 702 be any suitable solder mask material or other protective coating. Solder mask layer 702 may be formed in any manner, as would be known to persons skilled in the relevant art(s). For example, solder mask layer 702 may be formed according to a spraying process, a silkscreen process, a vacuum lamination process, or any other suitable process, as would be known to persons skilled in the relevant art(s).

Figure 8:
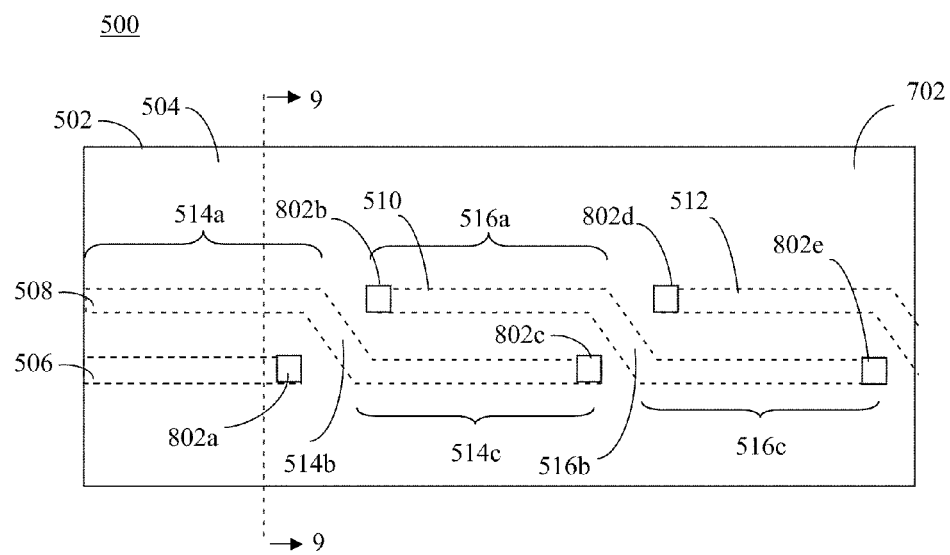
Figure 9:
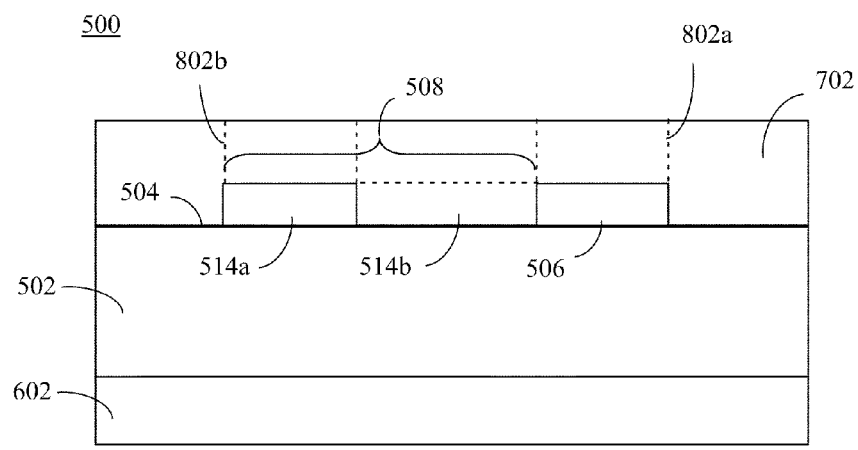

In step 406, the end of the first conductor and the end of the third conductor are exposed through the solder mask layer. For example, FIG. 8 shows the top view of circuit board 500, and FIG. 9 shows the cross-sectional view of circuit board 500, with openings 802 formed through solder mask layer 702, according to an example embodiment. As shown in FIG. 8, first-fourth conductors 506-512 are covered by solder mask layer 702 (first-fourth conductors 506-512 are indicated by dotted lines due to the presence of solder mask layer 702). In FIG. 9, first conductor 506 and portions 514a and 514b of second conductor 510 are visible on surface 504 of electrically insulating layer 502, covered by solder mask layer 702. Furthermore, in FIGS. 8 and 9, openings 802 are shown formed through solder mask layer 702 to expose and provide access to various conductors. For example, in FIG. 8, openings 802a-802e are formed through solder mask layer 702 to expose ends of first conductor 506, first portion 516a of third conductor 510, third portion 514c of second conductor 508, the first portion of fourth conductor 512, and third portion 516c of third conductor 510. By exposing portions of conductors by forming openings 802, cross-over routing may be formed to couple together conductors at cross-over locations.

Openings 802 may be formed through solder mask layer 702 in any manner, including by forming solder mask layer 702 in a pattern that includes openings 802, by etching openings 802 through solder mask layer 702, by drilling openings 802 through solder mask layer 702, or by any other suitable process. Openings 802a and 802b may each be formed to have any suitable area and shape, including having a width less than a width of a corresponding conductor, having a width substantially equal to the width of the corresponding conductor (as shown in FIGS. 8 and 9), or having a width greater than the width of the corresponding conductor. For example, openings 802 may be circular openings, rectangular openings (as shown in FIG. 8), or other shaped openings.

Figure 10:
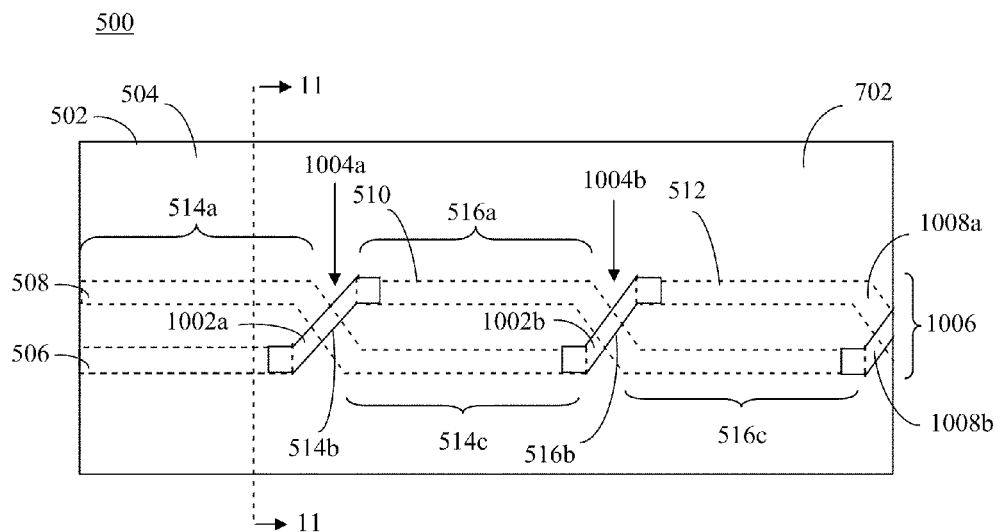
Figure 11:
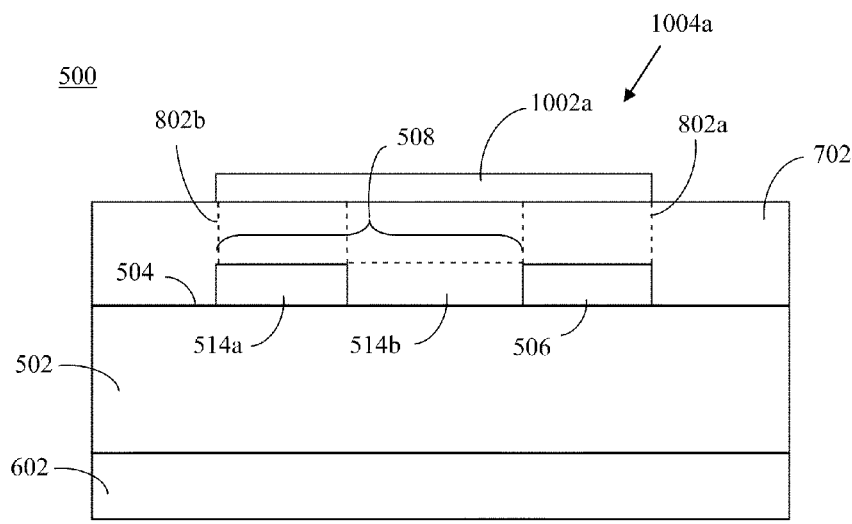

In step 408, the exposed end of the first conductor is coupled to the exposed end of the third conductor over the solder mask layer with an electrically conductive bridge. For example, FIG. 10 shows the top view of circuit board 500, and FIG. 11 shows the cross-sectional view of circuit board 500, with electrically conductive bridges 1002 formed on solder mask layer 702 to form a twisted differential conductor pair 1006, according to an example embodiment. As shown in FIG. 10, first and second electrically conductive bridges 1002a and 1002b are formed on solder mask layer 702, respectively corresponding to first and second cross-over locations 1004a and 1004b (a third electrically conductive bridge is partially viewable in FIG. 10 that corresponds to a partially viewable third cross-over location). Electrically conductive bridge 1002a electrically couples the end of first conductor 506 exposed through opening 802a to the end of third conductor 510 exposed through opening 802b, and electrically conductive bridge 1002b electrically couples the end of second conductor 508 exposed through opening 802c to the end of fourth conductor 512 exposed through opening 802d. As shown in FIG. 11, a first end of electrically conductive bridge 1002a is coupled to the end of first conductor 506 through opening 802a, and a second end of electrically conductive bridge 1002a is coupled to the end of first portion 514a of second conductor 508 through opening 802b. In a similar fashion, electrically conductive bridge 1002b electrically couples the end of third portion 514c of second conductor 508 through opening 802c to the end of the first portion of fourth conductor 512 through opening 802d.

In this manner, twisted differential conductor pair 1006 is formed. Twisted differential conductor pair 1006 includes first and second conductors 1008a and 1008b, which are twisted together. First conductor 1008a includes first conductor 506, first bridge 1002a, third conductor 510, a next bridge, and may include any further number of conductors and bridges not visible in FIG. 10. Second conductor 1008b includes second conductor 508, second bridge 1002b, fourth conductor 512, and may include any further number of conductors and bridges not visible in FIG. 10. Note that first-fourth conductors 506, 508, 510, and 512 may be referred to as "conductor segments," because they are combined together as described above to form conductors 1008a and 1008b (first and third conductors 506 and 510 are segments of conductor 1008a, and second and fourth conductors 508 and 512 are segments of conductor 1008b).

Electrically conductive bridges 1002 may be formed on a circuit board in any suitable manner, including by a plating process, a deposition process, a screen printing process, a pick-and-place process, or an ink-jet printing process. The material of bridges 1002 may be applied in a solid form or in a liquid form that may subsequently form a solid (e.g., by drying, a curing process, etc.). The material of bridges 1002 may be an electrically conductive material such as an electrically conductive polymer or a metal such as copper, aluminum, gold, silver, tin, nickel, lead, or a combination of metals/alloy, or may be formed of an alternative electrically conductive material. For example, bridges 1002 may be a metal foil, a metallic paint, an electrically conductive resin or epoxy, an electrically conductive ink, an electrically conductive paste (e.g., a solder paste), or other suitable electrically conductive material. In an embodiment, a bridge 1002 may be applied as a solid object, such as a pin, a rod, a metal strip, etc. The solid object may have any suitable shape, including being flat, squared, rounded, etc., and may optionally be shaped to have ends (e.g., pins) that extend from bridge 1002 into openings 802 to contact respective conductors. In another embodiment, an electrically conductive material, such as a solder material, an electrically conductive epoxy, or other electrically conductive adhesive, may be deposited into openings 802 prior to applying bridges 1002 to circuit board 500. The mechanical dimensions of bridge 1002, such as length, thickness, and/or width, and/or the dimensions of openings 802 may be selected to achieve and/or enhance desired performance attributes/characteristics.

Figure 12:
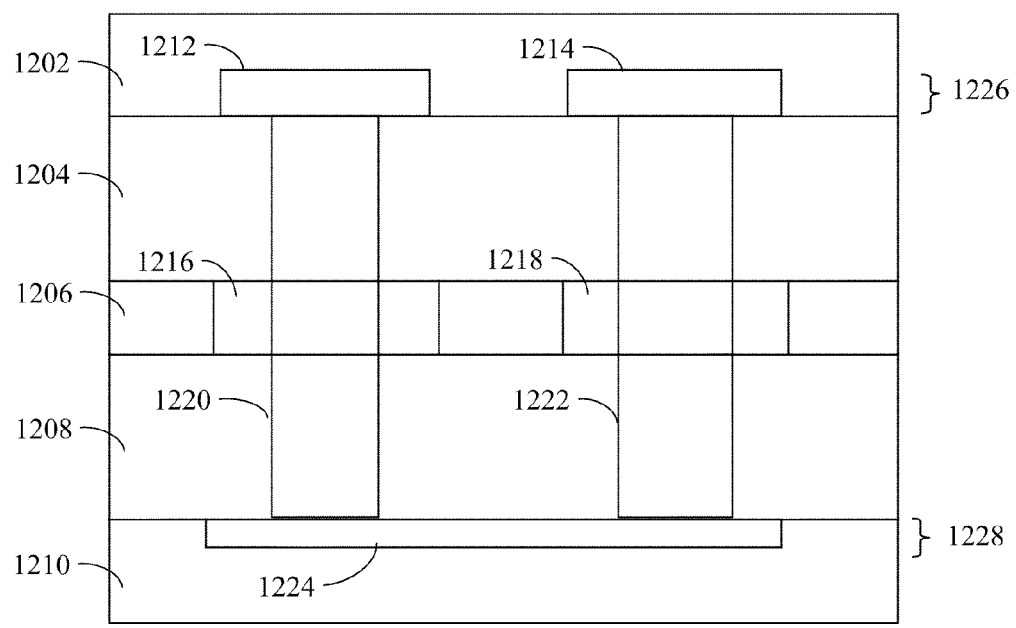
FIG. 12 shows a circuit board that includes conventionally formed cross-over routing for a twisted differential pair.

As shown in FIG. 11, cross-over location 1004a, which includes bridge 1002a, does not require that vias be formed through electrically insulating layer 502 and/or through reference plane layer 602, and does not require an additional electrically conductive layer similar to the layer of circuit board 500 that includes first-fourth conductors 506, 508, 510, and 512. For example, FIG. 12 shows a circuit board 1200, which includes a conventionally formed cross-over for a twisted differential pair. Circuit board 1200 includes a stack of a first electrically conductive layer 1226, a first electrically insulating layer 1204, a reference plane layer 1206, a second electrically insulating layer 1208, and a second electrically conductive layer 1228. A first solder mask layer 1202 is formed on first electrically insulating layer 1204, and a second solder mask layer 1210 is formed on second electrically insulating layer 1210.

As shown in FIG. 12, a cross-over between first and second conductors 1212 and 1214 is formed that includes a third conductor 1224 (in FIG. 12, it is assumed that first and second conductors 1212 are the conductors being coupled together in a cross-over location; the cross-under conductor is not shown in FIG. 12 for ease of illustration). As shown in FIG. 12, first and second conductors 1212 and 1214 are formed in first electrically conductive layer 1226, and third conductor 1224 is formed in second electrically conductive layer 1228. A first via 1220 (filled with a conductive material) is formed through first electrically insulating layer 1204, reference plane layer 1206, second electrically insulating layer 1208 to couple first conductor 1212 to third conductor 1224. A second via 1222 (filled with a conductive material) is formed through first electrically insulating layer 1204, reference plane layer 1206, second electrically insulating layer 1208 to couple second conductor 1214 to third conductor 1224.

As such, the cross-over shown in FIG. 12 in circuit board 1200 has disadvantages relative to the embodiment of FIG. 11, including requiring a larger number of circuit board layers, and requiring vias to be formed through first electrically insulating layer 1204, reference plane layer 1206, second electrically insulating layer 1208, leading to greater cost and complexity. Performance disadvantages may occur in circuit board 1200 relative to the embodiment of FIG. 11, including noise being coupled between reference plane layer 1206 and the electrical signals transmitted through reference plane layer 1206 by vias 1220 and 1222. In circuit board 1220, first, second, and third conductors 1212, 1214, and 1224 typically must have via pads (e.g., widened regions of conductive material around vias 1220 and 1222) to accommodate fabrication tolerances, leading to parasitic capacitances that cause performance issues when compared to the embodiment of FIG. 11. As shown in FIG. 11, via pads are not required, because vias are not present, and techniques for forming openings 802 through solder mask layer 702, and for applying bridges 1002, do not have the tolerance issues related to forming vias 1220 and 1222 in circuit board 1200.

B. Example Twisted Differential Conductor Pair Embodiment Performance Benefits

Figures 13, 14:
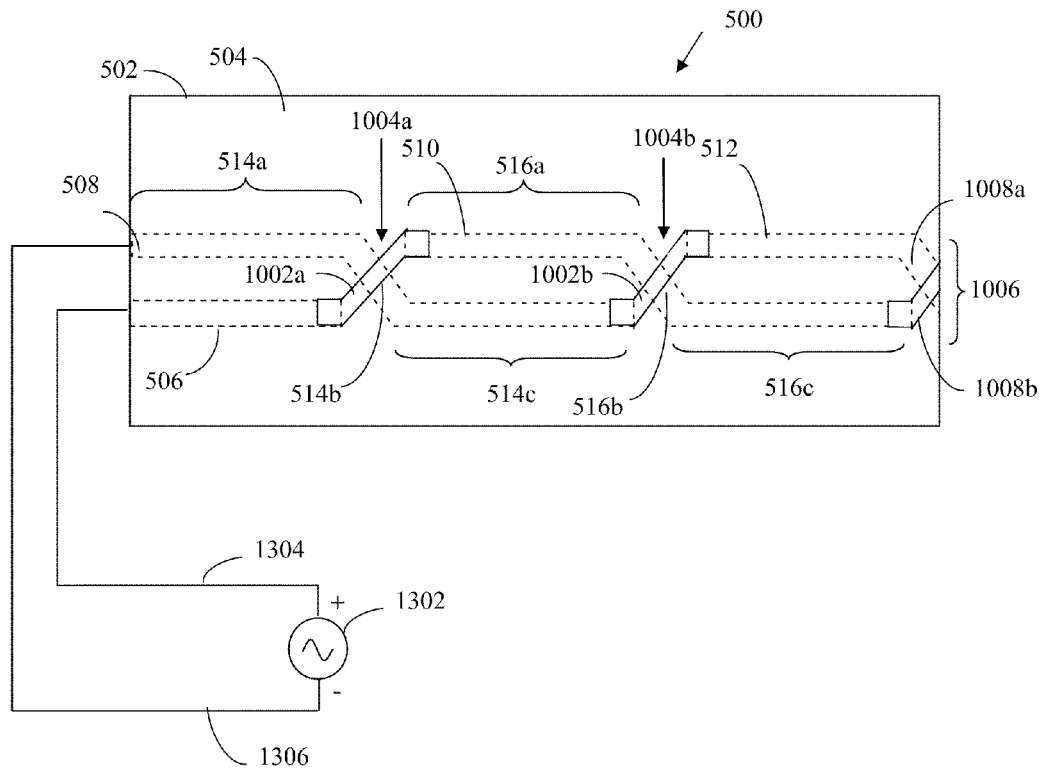
FIG. 13 shows a circuit board, with an electrical signal source applied to a twisted differential conductor pair, according to an example embodiment.
FIG. 14 shows a process that may be performed to configure a twisted differential conductor pair, according to an example embodiment.

As described above, twisted differential conductor pair embodiments may be used to transmit differential signals with electrical performance benefits, such as reduced differential mode crosstalk and EMI radiation, greater common mode rejection, and/or further benefits. For instance, FIG. 13 shows circuit board 500, with an electrical signal source 1302 applied to twisted differential conductor pair 1006, according to an example embodiment. As shown in FIG. 13, a first signal 1304 of a differential signal generated by electrical signal source 1302 is coupled to first conductor 506, and a second signal 1306 of the differential signal generated by electrical signal source 1302 is coupled to first portion 514a of second conductor 508. First and second signals 1304 and 1306 may be complementary signals. First signal 1304 is conducted through first conductor 506, bridge 1002a, third conductor 510, a next bridge 1002, etc., through circuit board 500. Second signal 1306 is conducted through second conductor 508, second bridge 1002b, fourth conductor 512, etc., through circuit board 500. In this manner, first and second signals 1302 and 1304 are transmitted through twisted conductors, deriving the corresponding electrical performance benefits.

Electrical signal source 1302 may be any type of electrical signal source, including an electrical component, circuit, or other signal source on circuit board 500 or external to circuit board 500.

Note that the electrical performance benefits provided by twisted differential conductor pair 1006 may be calibrated/ selected by configuring various attributes of twisted conductor pair 1006. For instance, FIG. 14 shows a step 1402 that may be performed to configure a twisted differential conductor pair 1006, according to an example embodiment. In step 1402, at least one of an area of a loop formed by the second conductor, the third conductor, the first bridge, and the second bridge and/or a distance between the second portion of the second conductor and the second portion of the third conductor may be configured to enable a desired electrical performance. For example, referring to FIG. 13, second conductor 508, third conductor 510, first bridge 1002a, and second bridge 1002b form a loop, similar to loops 212 and 214 shown in FIG. 2. An area of the loop may be configured in various ways, including by selecting/modifying a spacing between second and third conductors 508 and 510, and/or selecting/modifying a distance between first and second bridges 1002a and 1002b to modify a spacing (twist pitch) between cross-over locations 1004a and 1004b. Each loop of twisted differential conductor pair 1006 may be similarly modified to achieve particular electrical performance characteristics.

Performance benefits for various configurations of embodiments may be shown by simulation. For instance, simulations were performed using Ansoft HFSS™, a simulation tool distributed by Ansoft, LLC, of Pittsburgh, Pa., to study performance benefits achieved through twisted differential conductor pairs formed according to embodiments. The simulations were performed to compare electrical performance of a non-twisted differential conductor pair (e.g., as shown in FIG. 1) versus an embodiment of twisted differential conductor pair 1006 having cross-over locations every 3 mm (e.g., a twist pitch of 3 mm to form loops having widths of 3 mm). According to results of the simulations, the differential mode next-end coupling between two adjacent differential pairs improve by more than 20 dB at lower frequencies for twisted differential conductor pair 1006 versus a non-twisted differential conductor pair. The differential mode return loss decreased in performance, as was expected due to an imbalance caused by the twisting, because one of conductors 1008a and 1008b included one more bridge 1002 than the other, and the locations of bridges 1002 are different for first and second conductors 1008a and 1008b. However, a benefit in near-end cross-talk is received by twisted differential conductor pair 1006 versus the non-twisted differential conductor pair, which may outweigh any deficiencies in the return loss. Any decrease in such electrical performances may be reduced by configuring a particular implementation of twisted differential conductor pair 1006 to match lengths of conductors 1008a and 1008b as closely as possible.

III. Conclusion

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents

What is claimed is:

1. A circuit board, comprising:
   an electrically insulating layer;
   a first conductor, a second conductor, and a third conductor on the electrically insulating layer, the second conductor having a first portion, a second portion, and a third portion, and the second portion of the second conductor extending between an end of the first conductor and an end of the third conductor and coupling an end of the first portion of the second conductor to an end of the third portion of the second conductor;
   an electrically insulating solder mask layer patterned with openings on the electrically insulating layer over the first, second, and third conductors, the solder mask layer including a solder mask material and being an outermost layer of a stack of layers comprising each layer of the circuit board; and
   an electrically conductive bridge on the solder mask layer that is coupled through a first patterned opening in the solder mask layer to the end of the first conductor and through a second patterned opening in the solder mask layer to the end of the third conductor, and being outside of the stack of layers of the circuit board.

2. The circuit board of claim 1, wherein the bridge crosses over the second portion of the second conductor and is electrically isolated from the second conductor by the solder mask layer.

3. The circuit board of claim 2, wherein the third conductor further includes a first portion, a second portion and a third portion, the circuit board further comprising:
   a fourth conductor on the circuit board, the second portion of the third conductor extending between a second end of the third portion of the second conductor and an end of the fourth conductor and coupling an end of the first portion of the third conductor to an end of the third portion of the third conductor; and
   wherein the solder mask layer is over the fourth conductor.

4. The circuit board of claim 3, further comprising:
   an electrically conductive second bridge on the solder mask layer that is coupled through a third opening in the solder mask layer to the second end of the third portion of the second conductor and through a fourth opening in the solder mask layer to the end of the fourth conductor.

5. The circuit board of claim 3, where the second conductor, the third conductor, the first bridge, and the second bridge form a loop having an area selected to improve near-end cross-talk.

6. The circuit board of claim 3, wherein the second portion of the second conductor and the second portion of the third conductor are separated by a distance configured to improve a differential mode next-end coupling between two adjacent differential pairs.

7. The circuit board of claim 1, wherein the bridge is a fourth conductor formed on the solder mask layer that couples the exposed end of the first conductor to the exposed end of the third conductor.

8. The circuit board of claim 1, wherein the bridge includes at least one of an electrically conductive strip or an electrically conductive pin formed on the solder mask layer to couple the exposed end of the first conductor to the exposed end of the third conductor.

9. The circuit board of claim 1, wherein the first conductor is coupled to a first signal of a differential signal, and the first portion of the second conductor is coupled to a second signal of the differential signal.

10. The circuit board of claim 1, wherein the first portion of the second conductor is substantially parallel with a first portion of the first conductor, the third conductor having a first portion that is substantially parallel with the third portion of the second conductor, the first portion of the first conductor being substantially colinear with the third portion of the second conductor, and the first portion of the third conductor being substantially colinear with the first portion of the second conductor.

11. A circuit board, comprising:

an electrically insulating layer;

a first conductor, a second conductor, and a third conductor on the electrically insulating layer, the second conductor extending between an end of the first conductor and an end of the third conductor;

an electrically insulating solder mask layer patterned with openings on the electrically insulating layer over the first, second, and third conductors, the solder mask layer including a solder mask material and being an outermost layer of a stack comprised of all layers of the circuit board; and an electrically conductive bridge on the solder mask layer, and outside of the stack of layers of the circuit board, that is coupled through a first opening in the solder mask layer to the end of the first conductor and through a second opening in the solder mask layer to the end of the third conductor.

12. The circuit board of claim 11, wherein the bridge crosses over the second conductor and is electrically isolated from the second conductor by the solder mask layer.

13. The circuit board of claim 12, further comprising:

a fourth conductor on the circuit board, the third conductor extending between an end of the second conductor and an end of the fourth conductor; and wherein the solder mask layer is over the fourth conductor.

14. The circuit board of claim 13, further comprising:

an electrically conductive second bridge on the solder mask layer that is coupled through a third opening in the solder mask layer to the end of the second conductor and through a fourth opening in the solder mask layer to the end of the fourth conductor.

15. The circuit board of claim 11, wherein the bridge is a metal conductor formed on the solder mask layer that couples the exposed end of the first conductor to the exposed end of the third conductor.

16. A circuit board, comprising:

an electrically insulating layer;

a solder mask layer patterned with openings on the electrically insulating layer, the solder mask layer including a solder mask material; and a twisted differential conductor pair that has multiple twists and that includes a plurality of electrical conductors on the electrically insulating layer in a same metal layer between the electrically insulating layer and the solder mask layer; and a plurality of electrically conductive bridges on top of the solder mask layer, each electrically conductive bridge having a first end coupled through a respective first opening in the solder mask layer to an end of a first electrical conductor of the plurality of electrical conductors, and having a second end coupled through a respective second opening in the solder mask layer to an end of a second electrical conductor of the plurality of electrical conductors, and being an outermost feature of the circuit board that is outside of a stack of layers comprising all layers of the circuit board.

17. The circuit board of claim 16, wherein each electrically conductive bridge crosses over a third electrical conductor of the plurality of electrical conductors and is isolated from the third electrical conductor by the solder mask layer.

18. The circuit board of claim 17, wherein the plurality of electrical conductors includes a first plurality of colinear electrical conductor portions and a second plurality of colinear electrical conductors portions that is parallel with the first plurality of colinear electrical conductor portions.

19. The circuit board of claim 18, wherein the twisted differential conductor pair is configured to conduct a pair of complementary signals.

20. The circuit board of claim 16, wherein at least one electrically conductive bridge comprises a metal foil, a metallic paint, an electrically conductive resin or epoxy, an electrically conductive ink, an electrically conductive paste, a pin, a rod, or a metal strip.

* * * * *